United States Patent [19]
Becker

[11] Patent Number: 5,770,498
[45] Date of Patent: Jun. 23, 1998

[54] PROCESS FOR FORMING A DIFFUSION BARRIER USING AN INSULATING SPACER LAYER

[75] Inventor: David S. Becker, Boise, Id.

[73] Assignee: Micron Technology, Inc., Boise, Id.

[21] Appl. No.: 594,794

[22] Filed: Jan. 31, 1996

[51] Int. Cl.⁶ .................................................. H01L 21/8242
[52] U.S. Cl. .......................... 438/239; 438/253; 438/396
[58] Field of Search ................................... 438/230, 231, 438/232, 239, 250, 253, 396

[56] References Cited

U.S. PATENT DOCUMENTS

| | | | |
|---|---|---|---|
| 4,757,026 | 7/1988 | Woo et al. | 438/231 |
| 4,760,033 | 7/1988 | Mueller | 438/231 |
| 5,126,280 | 6/1992 | Chan et al. | |
| 5,206,183 | 4/1993 | Dennison | 438/253 |
| 5,292,677 | 3/1994 | Dennison . | |
| 5,501,998 | 3/1996 | Chen | 438/396 |

*Primary Examiner*—Tuan H. Nguyen
*Attorney, Agent, or Firm*—Steven R. Ormiston

[57] ABSTRACT

An etch process that uses a single partially etched spacer insulating layer to form both sidewall spacers and a diffusion barrier that protect areas of the substrate during subsequent processing steps in the formation of semiconductor devices such as Dynamic Random Access Memories (DRAMs). The process includes the steps of: (a) forming a gate electrode over a semiconductor substrate; (b) defining first and second contact regions in the substrate adjacent sides of the gate electrode; (c) conformally depositing a spacer insulating layer over the gate electrode and the contact regions; and (d) partially etching the spacer insulating layer to remove only a portion of the thickness of the spacer insulating layer at least over the contact regions of the substrate.

11 Claims, 10 Drawing Sheets

PROCESS FOR FORMING A DIFFUSION BARRIER USING AN INSULATING SPACER LAYER

FIELD OF THE INVENTION

The invention relates generally to the formation of semiconductor devices and, more particularly, to an etch process for forming a diffusion barrier using an insulating spacer layer.

BACKGROUND OF THE INVENTION

Generally, integrated circuits are mass produced by forming many identical circuit patterns on a single silicon wafer, which is thereafter cut into many identical dies or "chips." Integrated circuits, also commonly referred to as semiconductor devices, are made of various materials that may be electrically conductive, electrically nonconductive (insulators) or electrically semiconductive. Silicon, in single crystal or polycrystalline form, is the most commonly used semiconductor material. Both forms of silicon can be made electrically conductive by adding impurities. The introduction of impurities into silicon is commonly referred to as doping. Insulating materials are also sometimes doped in order to allow the material to flow into a more planar state by heating the wafer. Dynamic Random Access Memories (DRAMs) are integrated circuit devices comprising arrays of memory cells which contain two basic components—a field effect access transistor and a capacitor. Typically, one side of the transistor is connected to one side of the capacitor. This connection is made between a capacitor bottom electrode or "storage node" and an active area. The substrate areas in a DRAM in which electrical connections are made are generally referred to as active areas. Active areas consist of discrete specially doped regions in the surface of the silicon substrate which serve as electrical contact points (or "buried contacts") as well as source/drain regions for the access transistor. The other side of the transistor and the transistor gate electrode are connected to external contacts—a bit line and a word line, respectively. The other side of the capacitor, the capacitor top electrode or "cell plate," is connected to a reference voltage. Therefore, the formation of the DRAM memory cell comprises the formation of a transistor, a capacitor, a connection between the capacitor and the transistor, and contacts to external circuits.

According to conventional processes such as those described in U.S. Pat. No. 5,292,677 issued Mar. 8, 1994 and U.S. Pat. No. 5,126,280 issued Jun. 30, 1992, DRAM memory cells are formed, in part, by constructing transistor gate electrodes over a thin pad oxide on the semiconductor substrate. A spacer insulating layer, typically made of silicon nitride or silicon dioxide, is thereafter conformally deposited over the gate electrodes and the substrate. This spacer insulating layer is patterned and etched to remove horizontal portions between the gate electrodes at the locations of the subsequently formed electrical contacts, commonly referred to as "buried contacts." The remaining vertical portions form insulating spacers along the sides of the gate electrodes. After transistor adjustment implants, sometimes referred to as source/drain implants, a second insulating layer is conformally deposited over the structure previously formed. This second insulating layer protects the buried contact areas as a diffusion barrier during subsequent processing. This insulating layer also provides protection to areas of the substrate in the periphery where the substrate will be exposed to doped oxide layers during subsequent processing.

One disadvantage of this conventional semiconductor fabrication process is the necessity of depositing two insulating layers to form the spacers and the diffusion barrier. In this process, as in all semiconductor fabrication processes, it is desirable to minimize the number of process steps and thereby reduce fabrication costs and increase production through-put. It would be advantageous to use a single insulating layer to form both the sidewall spacers and the diffusion barrier.

SUMMARY OF THE INVENTION

Accordingly, it is one object of the invention to reduce the number of process steps in the formation of semiconductor devices such as Dynamic Random Access Memory devices (DRAMs). It is another object to use a single insulating layer to form both the sidewall spacers and the diffusion barrier in the construction of such devices. These and other objects and advantages may be achieved by an etch process comprising the steps of: (a) forming a gate electrode over a semiconductor substrate; (b) defining first and second contact regions in the substrate adjacent sides of the gate electrode; (c) conformally depositing a spacer insulating layer over the gate electrode and the contact regions; and (d) partially etching the spacer insulating layer to remove only a portion of the thickness of the spacer insulating layer over at least the contact regions. In one preferred version of the invention, the spacer insulating layer is made of silicon nitride and it is etched to a thickness in the range of 50 angstroms to 400 angstroms.

Another aspect of the invention provides a process for making a dynamic random access memory cell. This DRAM fabrication process includes the steps of:

a. providing an integrated circuit wafer having a semiconducting substrate, a plurality of transistor gate members each comprising a gate insulating layer formed on the substrate and a gate conducting layer formed on the gate insulating layer, and first and second source/drain regions on the semiconducting substrate;

b. forming a spacer insulating layer over the wafer to cover the gate members and source/drain regions;

c. partially etching the spacer insulating layer to remove a portion of the thickness of the spacer insulating layer at least over the source/drain regions;

d. forming a lower insulating layer over the spacer insulating layer;

e. etching the lower insulating layer to form a capacitor container over the first source/drain region and to expose the spacer insulating layer over the first source/drain region;

f. etching the exposed portion of the spacer insulating layer to expose the first source/drain region;

g. forming a capacitor first conductor in the capacitor container, the first conductor being in electrical contact with the first source/drain region;

h. forming a capacitor dielectric layer on the capacitor first conductor; and i. forming a capacitor second conductor on the capacitor dielectric layer.

Again, the spacer insulating layer is preferably made of silicon nitride and it is etched to a thickness in the range of 50 angstroms to 400 angstroms.

The process of the invention, using a single partially etched spacer insulating layer to form a diffusion barrier to protect areas of the substrate in the periphery as well as in the array during subsequent processing, reduces the number of process steps in the formation of semiconductor devices such as DRAMs. Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

FIGS. 1–10 are cross section views illustrating a DRAM memory cell and peripheral region fabricated according to the preferred embodiment of the invention. More particularly.

The drawings are not meant to be actual views of a DRAM memory cell. Rather, the drawings depict idealized representations used to illustrate the process of the invention.

DETAILED DESCRIPTION OF THE INVENTION

The present invention will be described with reference to a DRAM container type memory cell. The invention, however, may be used in the fabrication of other semiconductor devices that utilized similar insulating spacer structures. Also, the invention will be described using lightly doped P-type silicon as the starting material, although the invention may be implemented with other substrate materials. If other substrate materials are used, then there may be corresponding differences in some materials and structures, as is well known in the art. FIGS. 1–10 depict the invented process used to form the memory cell. Each of these cross section views may represent a number of different individual process steps carried out to arrive at the particular structure shown. Since some of the individual process steps are conventional and well known to those skilled in the art of semiconductor device manufacturing, several of these steps have been combined in the various figures for the sake of simplicity and to better illustrate the preferred embodiment of the invented structure. For example, the fabrication of semiconductor devices includes etching predetermined patterns into layers of various material stacked over the semiconductor substrate. This process is sometimes referred to herein for convenience as "patterning and etching." Photolithography and reactive ion etching, for example, are commonly used pattern and etch processes. These or other pattern and etch processes, well known to those skilled in the art, may be used to implement the present invention.

Figure 1:
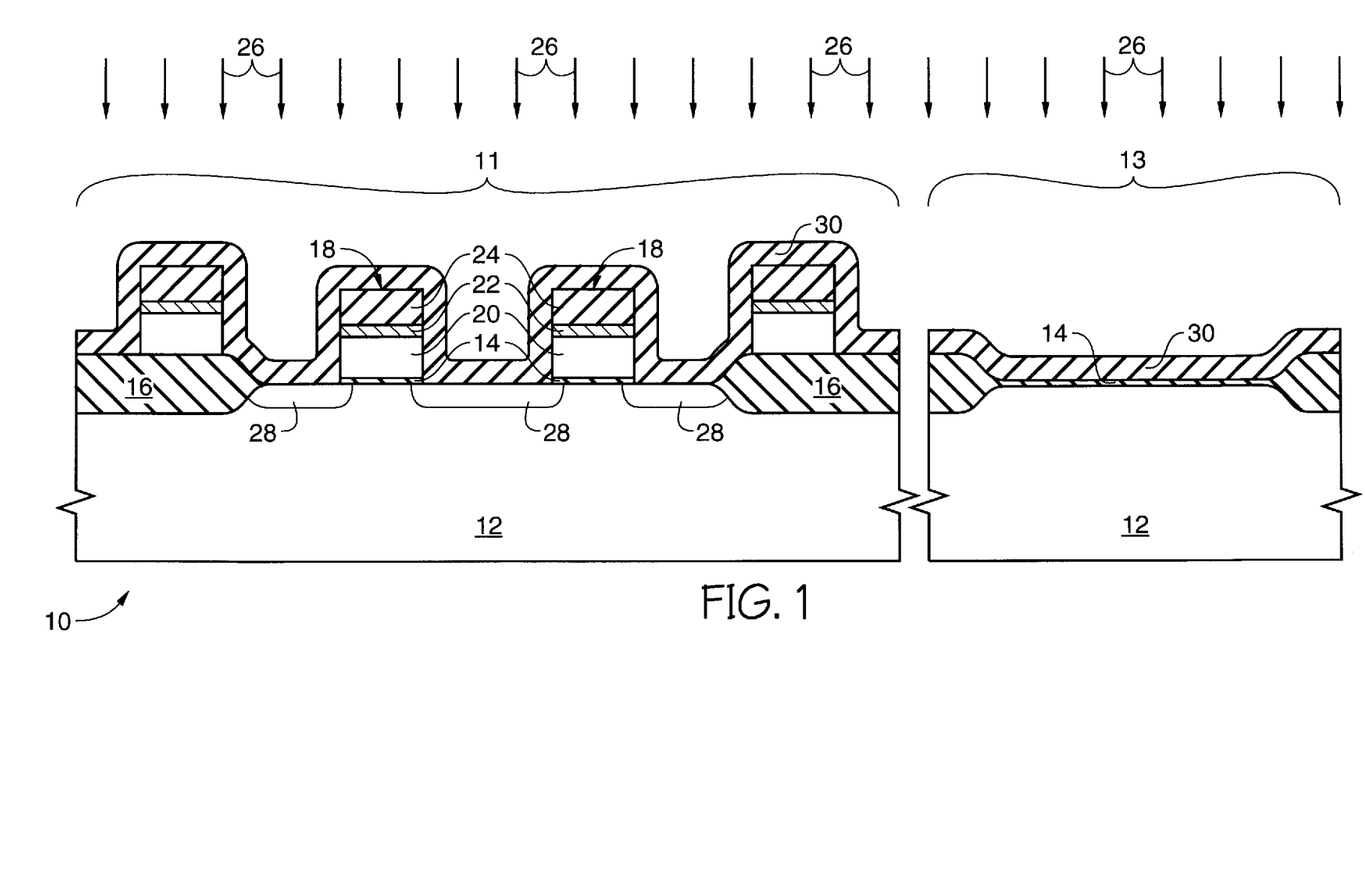
FIG. 1 shows the cell and periphery at the stage where the field oxide, gate insulating layer, gate electrodes and the first insulating layer have been formed.

Referring to FIG. 1, wafer 10 comprises a lightly doped p-type single crystal silicon substrate 12 which has been oxidized to form thin gate insulating layer 14 and thick field oxide regions 16. FIG. 1 depicts a memory cell array region 11 and a peripheral region 13. The field oxide regions 16 provide electrical isolation between the memory cell array and the periphery as well as between individual memory cells within the array. Field oxide region 16 is typically formed using Local Oxidation Of Silicon ("LOCOS") wherein an apertured layer of silicon nitride (not shown) or other non-oxidizable material is formed on the surface of substrate 12 and thereafter the exposed portions of the substrate are oxidized. The nitride layer is then removed. Transistor gate electrode 18 is formed by successively depositing or "stacking" layers of polysilicon 20, tungsten silicide 22 and silicon nitride 24 over thin gate insulating layer 14, and then patterning and etching those layers to expose substrate 12 at the desired locations of the source and drain for the access transistors. These layers, which are deposited and patterned and etched using conventional methods well known in the art, are also typically removed in much of the periphery, as shown in FIG. 1. Alternatively, transistor gate electrode 18 may be formed of a single layer of polysilicon deposited and etched as describe above. The tungsten silicide and silicon nitride layers are included herein simply to better illustrate the details of one of the preferred embodiments of the invention.

P-type impurities, typically boron atoms, are then implanted into the exposed portions of substrate 12, as shown symbolically by arrows 26. Boron ions are implanted at an energy level of approximately of 25–50 KeV, to a depth of approximately 1000 angstroms. The resulting doped p-regions 28 extend into the channel area between the subsequently formed source and drain for each access transistor. The boron implant improves the transistor characteristic by reducing short channel effects such as $V_t$ rollover, sub $V_t$ slope, punch-through and the like.

Figure 2:
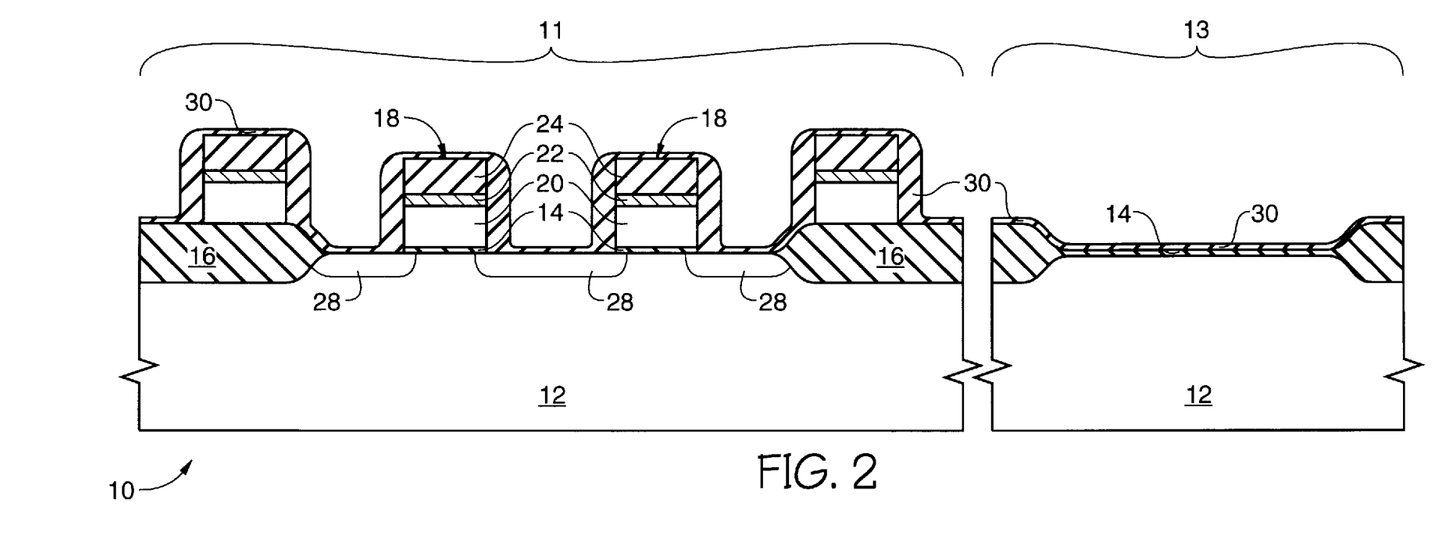
FIG. 2 shows the cell and periphery following the partial or "under etch" of the first insulating layer.

A spacer insulating layer 30 is then deposited over the in process structure to a thickness typically in the range of 600 angstroms to 2,000 angstroms. The thickness of spacer insulating layer 30 is not critical for purposes of the invented process, and will depend on cell spacing, desired spacer thickness and other design parameters. Spacer insulating layer 30 is preferably made of silicon nitride or other suitable insulating material that is selectively etchable with respect to oxide materials. In conventional processes, the horizontal portions of spacer insulating layer 30 would now be etched completely to form spacers along the sidewalls of gate electrodes 18 and to expose thin gate oxide 14 and the underlying contact regions 28 in substrate 12. By contrast, according to the present invention, spacer insulating layer 30 is patterned and etched to a thickness in the range of 50 angstroms to 400 angstroms, preferably about 100 angstroms, as shown in FIG. 2. That is, wafer 10 is targeted to "under etch" insulating layer 30 to leave about 100 angstroms of nitride material in the contact regions 28 between gate electrodes 18 and in the periphery 13. This nitride is preferably a timed anisotropic etch. The thickness of spacer insulating layer 30 remaining after this etch may adjusted as necessary to facilitate the subsequent source/drain implantation steps described below. Under etching spacer insulating layer 30 to leave a thin layer of nitride material provides a diffusion barrier during subsequent processing, as will be described in more detail below.

Figure 3:
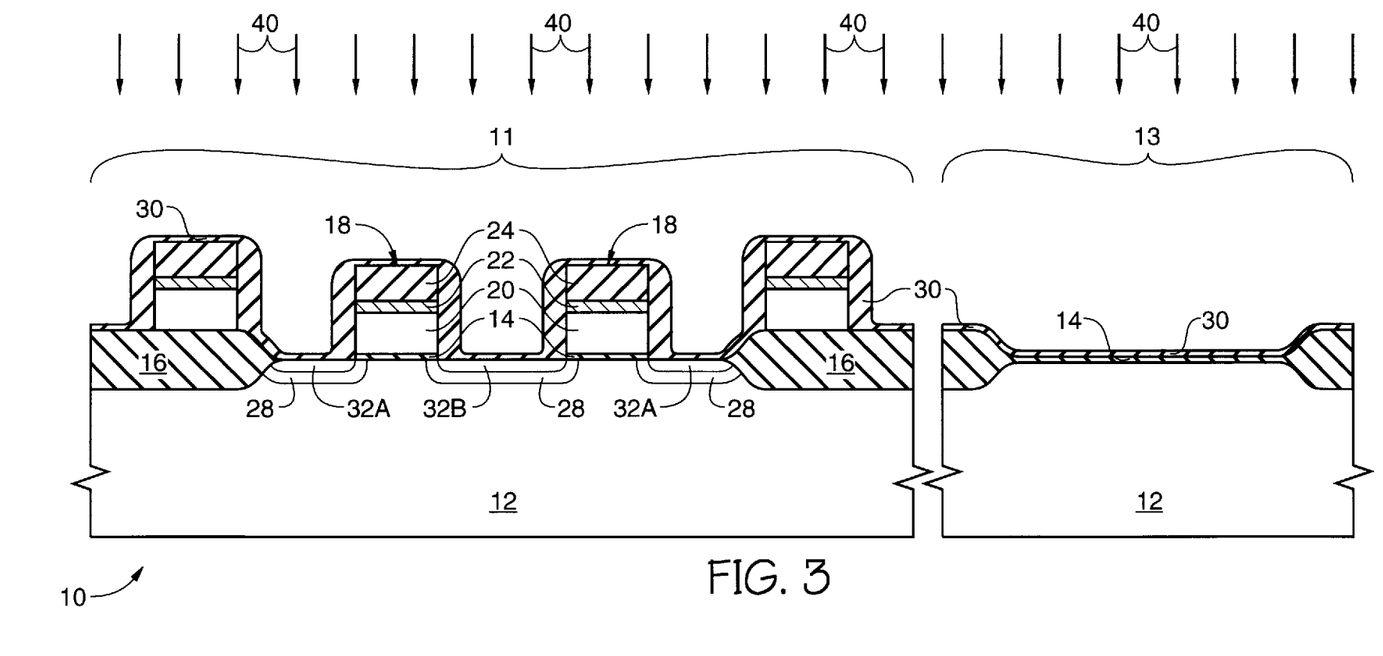
FIG. 3 shows the cell and periphery following the n-type LDD implant.

Referring to FIG. 3, lightly doped drain implants (LDDs) are formed by implanting n-type impurities, typically phosphorous or arsenic atoms, in the exposed portions of substrate 12. The implantation of the n-type impurities is shown symbolically by arrows 40. The LDDs form source/drain regions 32a and 32b. The capacitor first conductors 44 (shown on FIG. 6) will contact source/drain region 32a. This contact is sometimes referred to as the storage node contact or capacitor "buried" contact. The bit line contact 54, shown on FIG. 10, will contact source/drain region 32b. The LDD dopant is implanted at doses of approximately $1$-$5 \times 10^{13}$ ions per square centimeter and an implantation energy in the range of 20 to 100 KeV.

Figure 4:
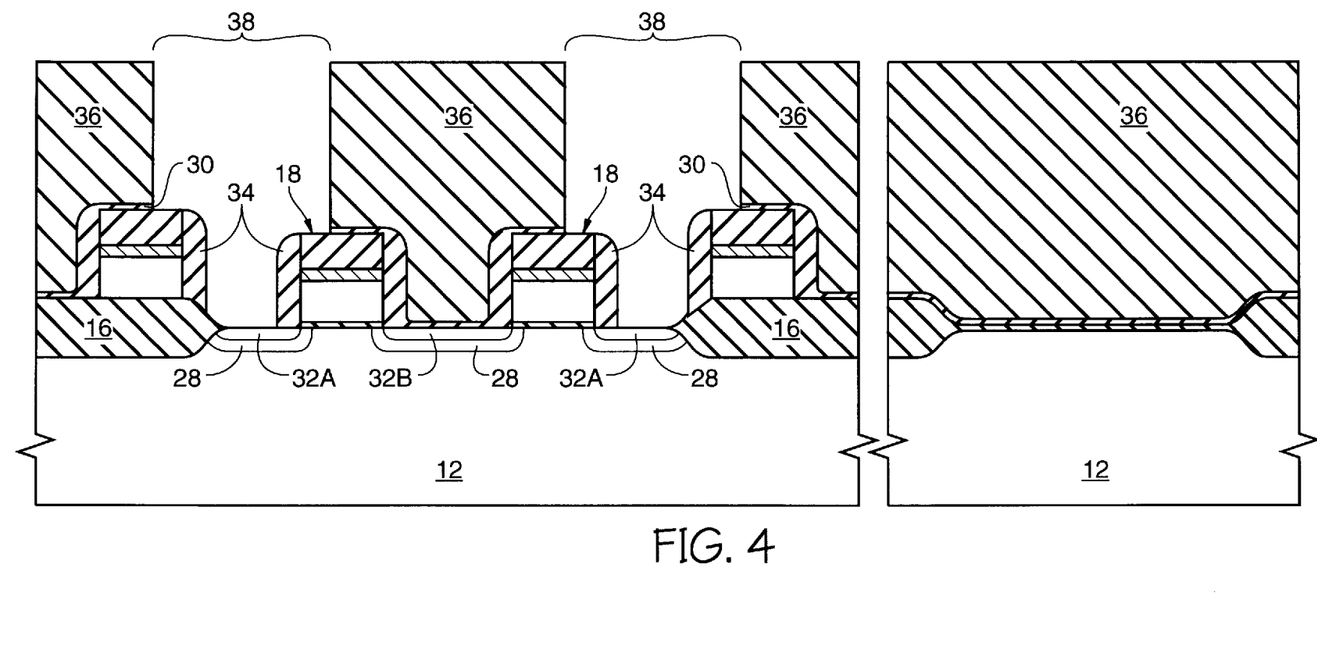
FIG. 4 shows the cell and periphery after the capacitor containers have been formed in a thick lower insulating layer of BPSG.

Referring to FIG. 4, a thick lower insulating layer 36, preferably made of borophospho-silicate glass (BPSG), is deposited and, if necessary, planarized. Lower insulating layer 36 is patterned and etched to define capacitor contact corridors 38 (also commonly referred to as the capacitor containers) in lower insulating layer 36. The etch of lower insulating layer 36 utilizes a oxide etch process that is selective to silicon nitride to protect spacer insulating layer 30 during any over etch of lower insulating layer 36. A suitable process for etching an oxide material formed on an underlying layer of silicon nitride is described in U.S. Pat. No. 5,286,344, incorporated herein by reference. Spacer insulating layer 30 serves as a diffusion barrier between lower insulating layer 36 and substrate 12. After lower insulating layer 36 has been completely removed from source/drain regions 32a, the etch chemistry is changed to remove the remainder of spacer insulating layer 30 and thereby expose source/drain regions 32a. This etch of the remainder of spacer insulating layer 30 produces the same spacer 34 profile as conventional processes.

Figure 5:
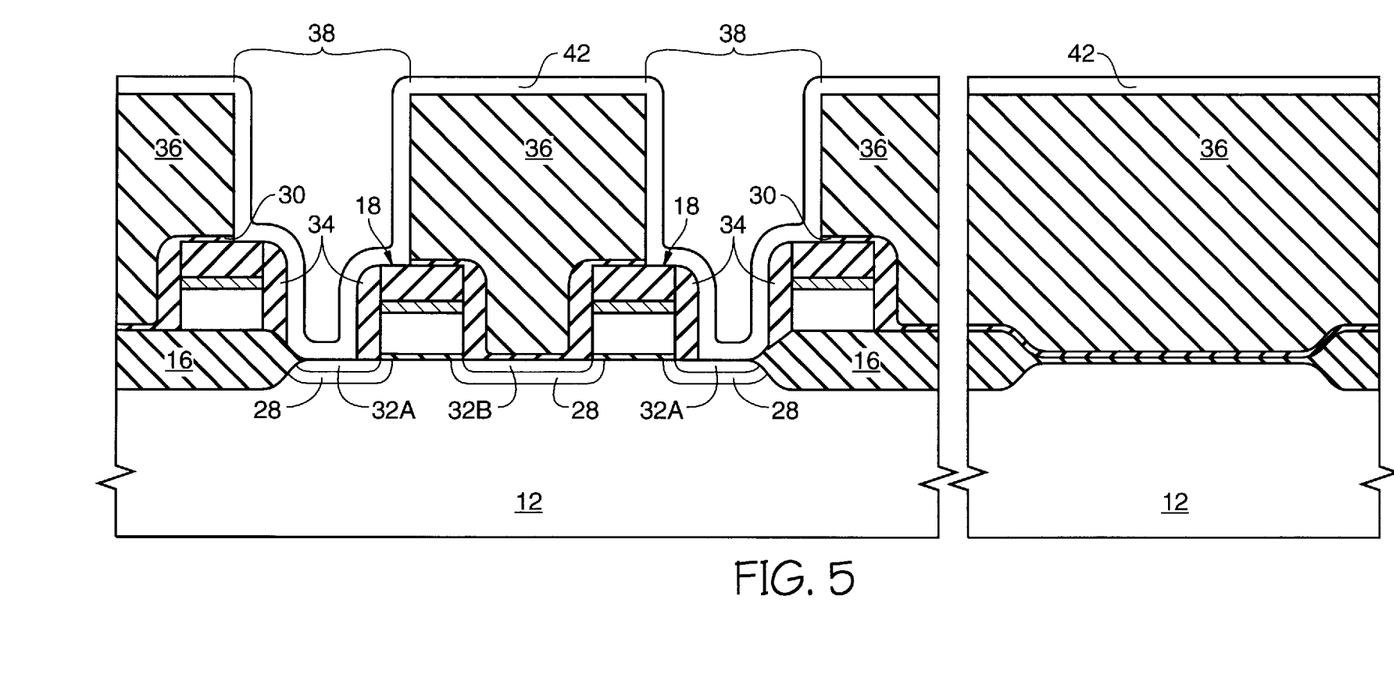
FIG. 5 shows the cell and periphery after the storage node polysilicon has be deposited.
Figure 6:
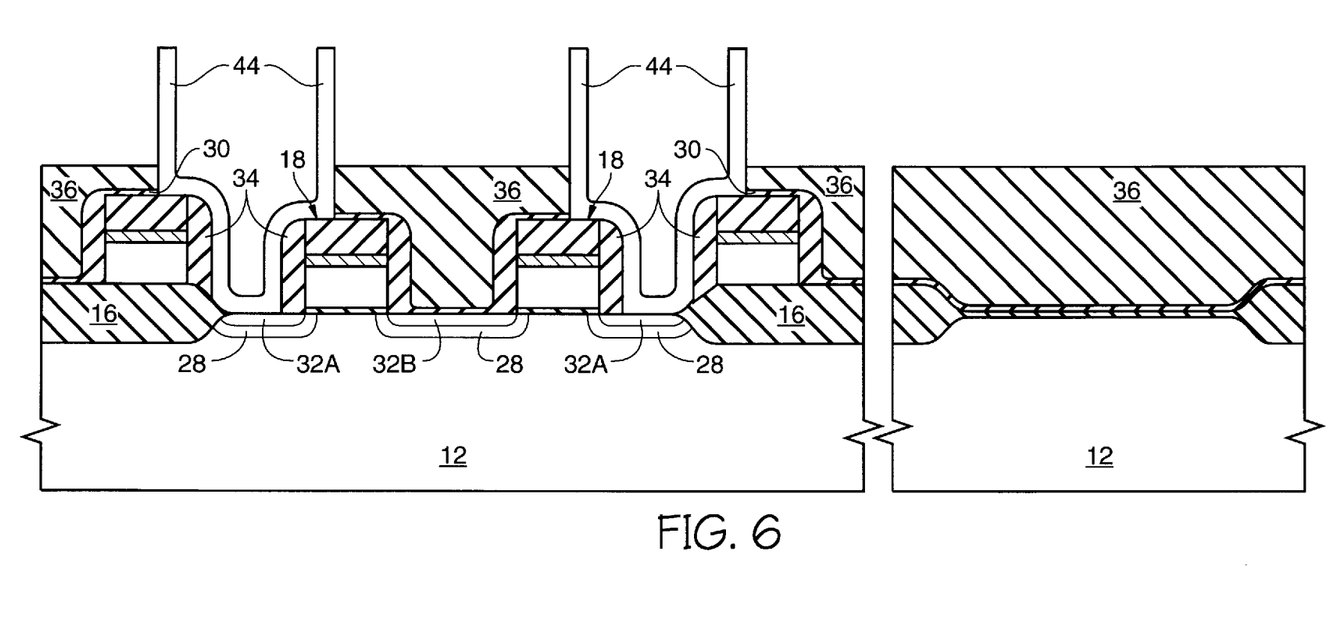
FIG. 6 shows the cell and periphery after the storage node polysilicon has been etched to form the capacitor first conductors.

Next, a layer of polysilicon 42, commonly referred to as the storage node poly, is deposited as shown in FIG. 5. Storage poly 42 is doped, preferably rough textured, polysilicon. The storage poly may be doped insitu, by implantation or by diffusion. Storage poly 42 is typically doped insitu with phosphorous. Referring to FIG. 6, storage poly 42 is patterned and etched or subjected to a chemical mechanical polish (CMP) to form capacitor first conductors 44. This storage poly etch may be followed by a partial oxide etch of lower insulating layer 36 which is selective to polysilicon so as not to etch the exposed storage poly. This oxide etch exposes much of the outer peripheries of capacitor first conductors 44, which significantly increases the capacitance area of the cell.

Figure 7:
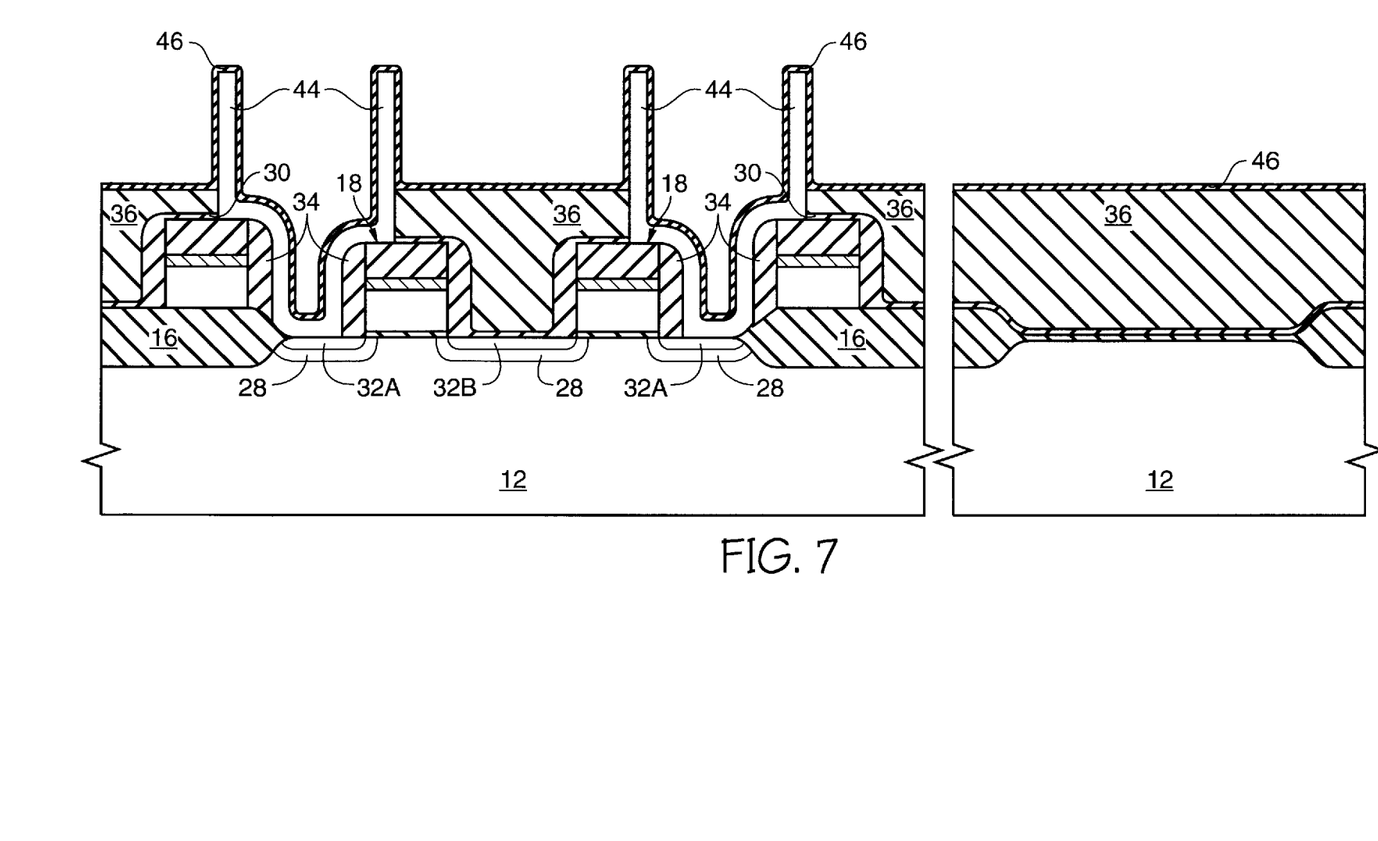
FIG. 7 shows the cell and periphery after the formation of the capacitor dielectric.

Referring to FIG. 7, capacitor dielectric 46 is deposited. Capacitor dielectric 46 is preferably made of silicon nitride or other materials with high dielectric constants.

Figure 8:
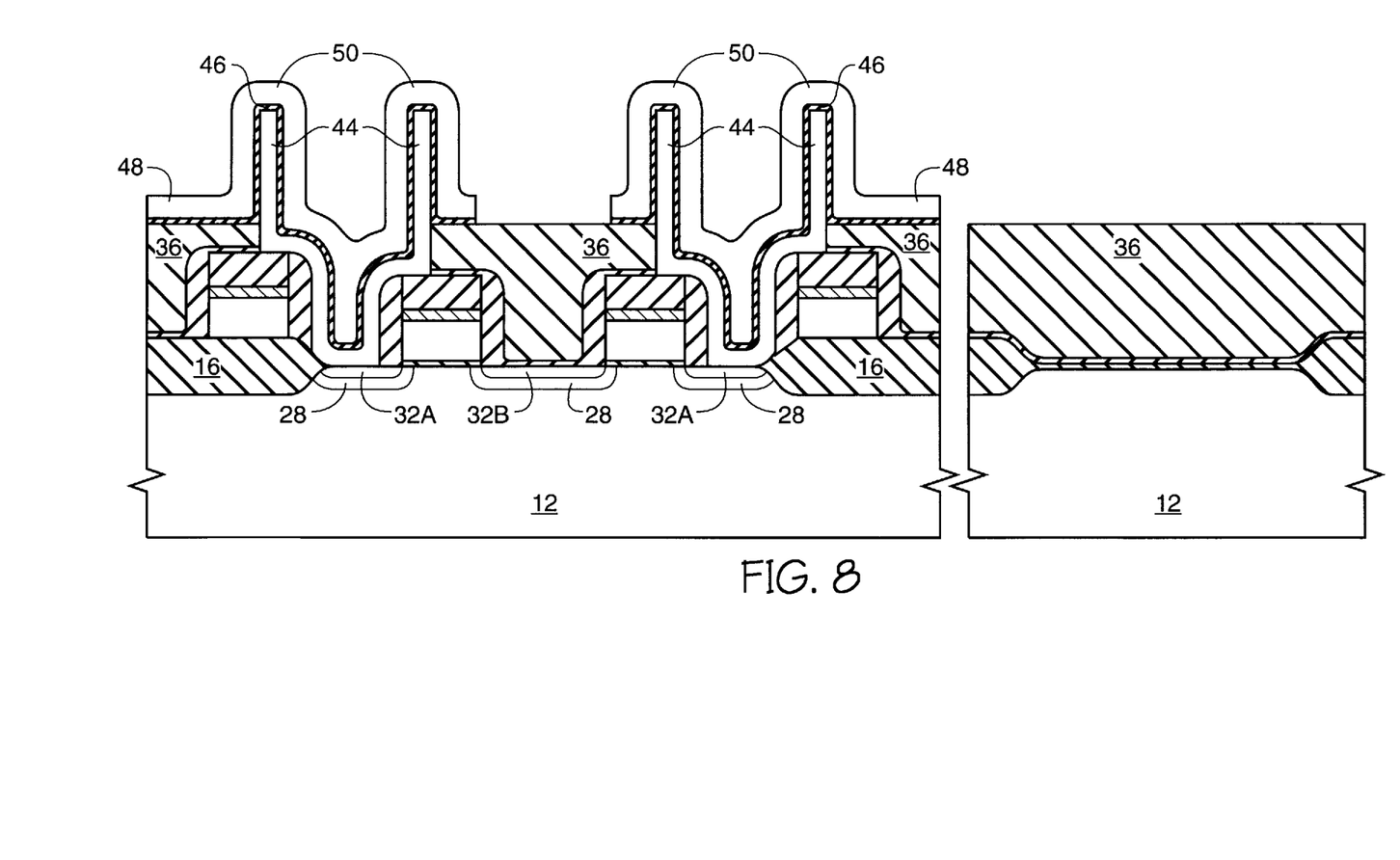
FIG. 8 shows the cell and periphery after the cell polysilicon has been deposited and etched to form the capacitor second conductor.

Referring to FIG. 8, polysilicon layer 48, commonly referred to as the cell poly, is deposited over the structure previously formed. Cell poly 48 is patterned and etched to form capacitor second conductor 50 and the etch may continue down through capacitor dielectric 46. This cell poly etch is preferably anisotropic, but a timed isotropic etch may also be used.

Figure 9:
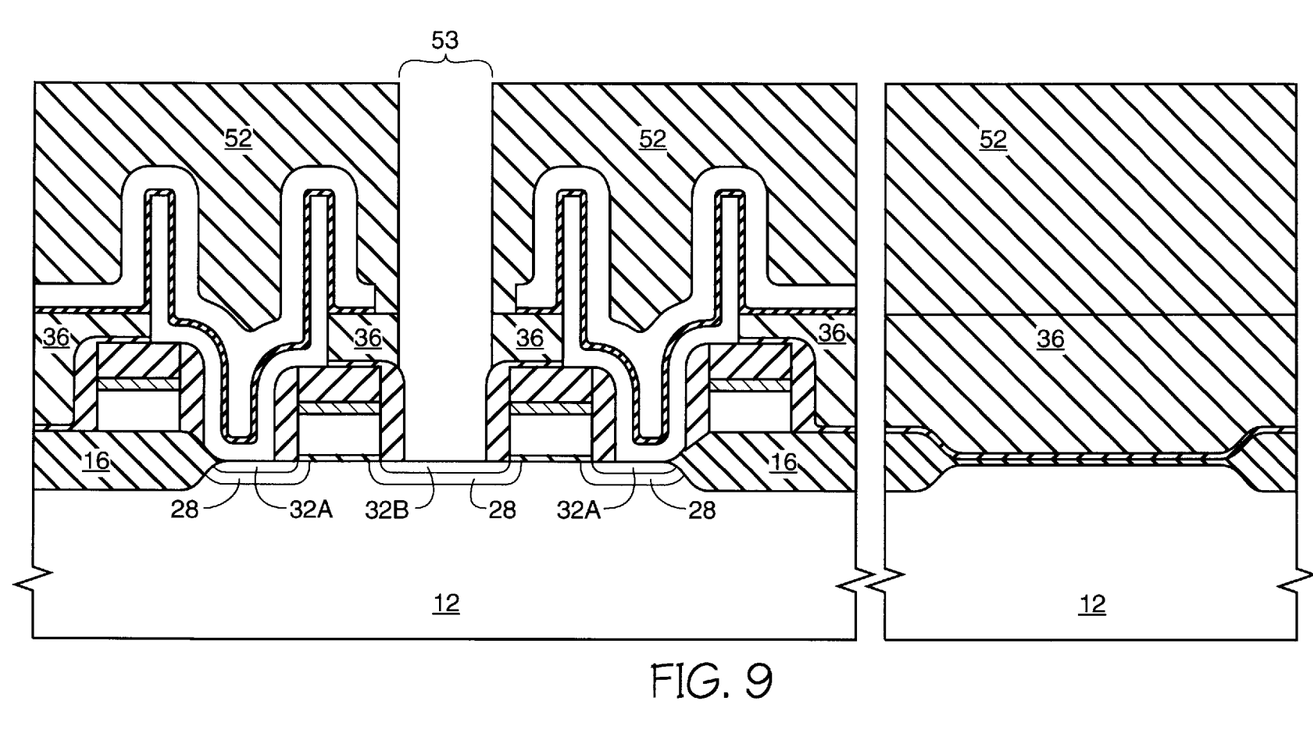
FIG. 9 shows the cell and periphery after a thick upper insulating layer of BPSG has been deposited and etched to form an opening for the bit line contact.

Referring to FIG. 9, a thick upper insulating layer 52 of BPSG or other suitable insulating material is formed over the exposed upper surfaces of the structure previously formed. Upper insulating layer 52 is patterned and etched to form an opening 53 for the bit line contact. Upper insulating layer 52 may be planarized using chemical mechanical polish (CMP) or other suitable processes prior to etching. The etch of upper insulating layer 52 utilizes an oxide etch process that is selective to silicon nitride to protect the remainder of spacer insulating layer 30 over bit line contact area 32b during any over etch of upper insulating layer 52. After upper insulating layer 52 has been completely removed from the bit line contact corridor, the etch chemistry is changed to remove the remainder of spacer insulating layer 30 and thereby expose source/drain region 32b. In an alternative process flow commonly used in the fabrication of DRAM memory cells, the cell poly etch is combined with the bit line contact opening etch. As will be apparent to those skilled in the art, if this alternative process flow is used, spacer insulating layer 30 protects source/drain region 32b during oxidation steps necessary to isolate portions of the cell poly 50 exposed during the bit line contact corridor etch.

Figure 10:
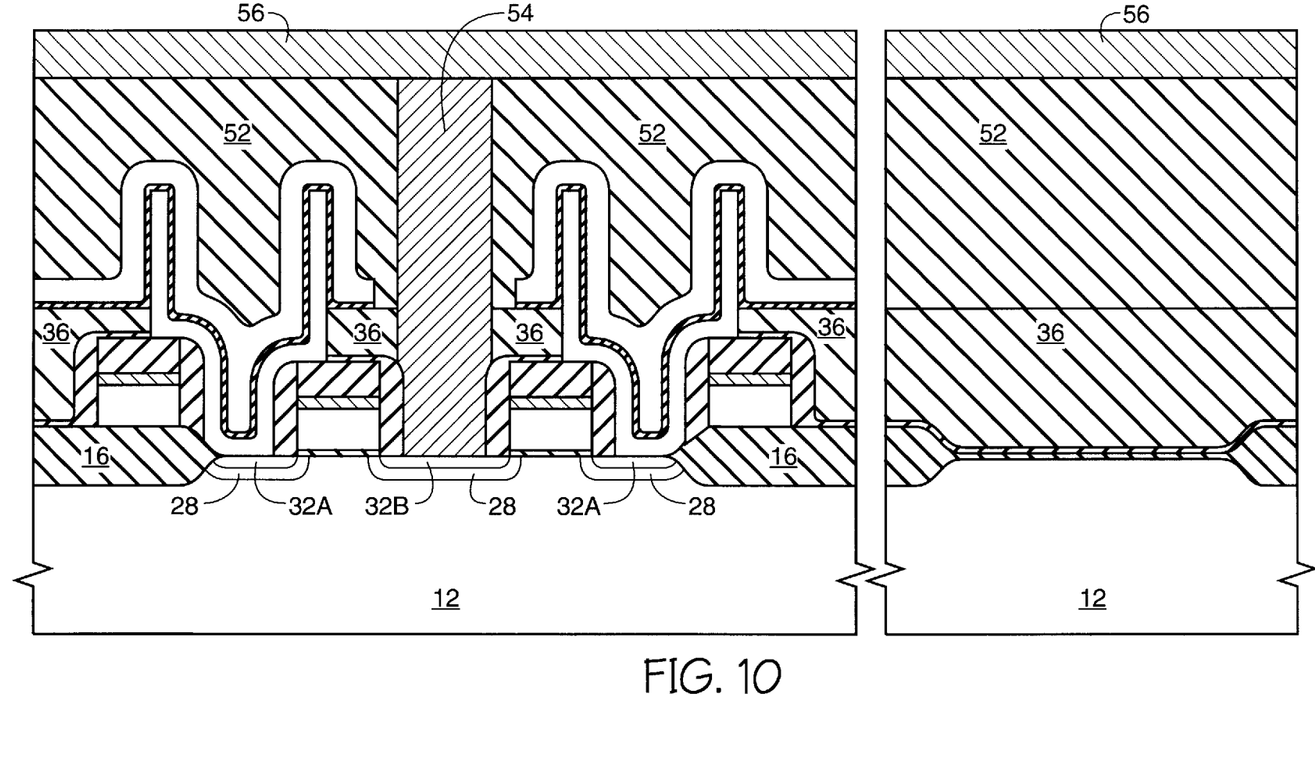
FIG. 10 shows the completed memory cell.

Referring to FIG. 10, bit line contact 54 and bit line 56 are formed using metal deposition techniques well known in the art.

There has been shown and described an etch process that uses a single insulating layer to form both sidewall spacers and an diffusion barrier in the construction of a container type DRAM memory cell. The invention could be readily incorporated into the process flow for fabrication of other types of semiconductor devices that utilize similar structures such as poly plug type container cell and stacked capacitor type DRAM memory cells, Static Random Access Memories (SRAMs), and some types of logic circuit semiconductor devices. The particular embodiments shown and described herein are for purposes of example and should not be construed to limit the invention as set forth in the appended claims.

I claim:

1. A process for making a semiconductor device, comprising the steps of:
   a. forming a gate electrode over a semiconductor substrate;
   b. defining first and second contact regions in the substrate adjacent sides of the gate electrode;
   c. conformally depositing a spacer insulating layer over the gate electrode and the contact regions;
   d. partially etching the spacer insulating layer to remove only a portion of the thickness of the spacer insulating layer at least over the contact regions;
   e. forming a lower insulating layer over the spacer insulating layer;
   f. patterning and etching the lower insulating layer to form a capacitor container over the first contact region and to expose the spacer insulating layer over the first contact region; and
   g. etching the exposed portion of the spacer insulating layer to expose the first contact region.

2. A process according to claim 1, wherein the spacer insulating layer is made of a material that is selectively etchable with respect to the lower insulating layer.

3. A process according to claim 2, wherein the spacer insulating layer is made of silicon nitride.

4. A process according to claim 2, further comprising the steps of:
   a. forming a capacitor first conductor in the capacitor container, the first conductor being in electrical contact with the first contact region;
   b. forming a capacitor dielectric layer on the capacitor first conductor; and c. forming a capacitor second conductor on the capacitor dielectric layer.

5. A process according to claim 4, further comprising the steps of:

a. forming an upper insulating layer on the wafer;
   b. patterning and etching the upper insulating layer to form an opening over the second contact region and to expose the spacer insulating layer over the second contact region;
   c. etching the exposed portion of the spacer insulating layer to expose the second contact region; and
   d. forming a contact in the opening, the contact being in electrical contact with the second contact region.

6. A process for making a dynamic random access memory cell, comprising the steps of:

a. providing an integrated circuit wafer having a semiconducting substrate, a plurality of transistor gate members each comprising a gate insulating layer formed on the substrate and a gate conducting layer formed on the gate insulating layer, and first and second source/drain regions on the semiconducting substrate;
   b. forming a spacer insulating layer over the wafer to cover the gate members and source/drain regions;
   c. partially etching the spacer insulating layer to remove a portion of the thickness of the spacer insulating layer at least over the source/drain regions;
   d. forming a lower insulating layer over the spacer insulating layer;
   e. patterning and etching the lower insulating layer to form a capacitor container over the first source/drain region and to expose the spacer insulating layer over the first source/drain region;
   f. etching the exposed portion of the spacer insulating layer to expose the first source/drain region;
   g. forming a capacitor first conductor in the capacitor container, the first conductor being in electrical contact with the first source/drain region;
   h. forming a capacitor dielectric layer on the capacitor first conductor; and
   i. forming a capacitor second conductor on the capacitor dielectric layer.

7. A process according to claim 6, further comprising the steps of:

a. forming an upper insulating layer on the wafer;
   b. patterning and etching the upper insulating layer to form an opening over the second source/drain region and to expose the spacer insulating layer over the second source/drain region;
   c. etching the exposed portion of the spacer insulating layer to expose the second source/drain region; and
   d. forming a contact in the opening, the contact being in electrical contact with the second source/drain region.

8. A process according to claim 6, wherein the spacer insulating layer is made of a material that is selectively etchable with respect to oxide materials.

9. A process according to claim 6, wherein the spacer insulating layer is made of silicon nitride.

10. A process according to claim 6, wherein the spacer insulating layer is etched to a thickness in the range of 50 angstroms to 400 angstroms.

11. A process according to claim 6, wherein the spacer insulating layer is anisotropically etched to form substantially vertical spacers along sidewalls of the gate electrodes.

* * * * *